United States Patent
Onishi et al.

(10) Patent No.: US 9,306,148 B2
(45) Date of Patent: Apr. 5, 2016

(54) OSCILLATOR DEVICE AND ELECTRONIC APPARATUS

(75) Inventors: Yasuharu Onishi, Kanagawa (JP); Yuichiro Kishinami, Kanagawa (JP); Shigeo Satou, Kanagawa (JP); Jun Kuroda, Kanagawa (JP); Yukio Murata, Kanagawa (JP); Motoyoshi Komoda, Kanagawa (JP); Nobuhiro Kawashima, Kanagawa (JP); Tatsuya Uchikawa, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 378 days.

(21) Appl. No.: 13/990,904

(22) PCT Filed: Dec. 20, 2011

(86) PCT No.: PCT/JP2011/007099
§ 371 (c)(1),
(2), (4) Date: May 31, 2013

(87) PCT Pub. No.: WO2012/086180
PCT Pub. Date: Jun. 28, 2012

(65) Prior Publication Data
US 2013/0242702 A1 Sep. 19, 2013

(30) Foreign Application Priority Data
Dec. 20, 2010 (JP) .................. 2010-282666

(51) Int. Cl.
*H04R 17/00* (2006.01)
*H01L 41/053* (2006.01)
(Continued)

(52) U.S. Cl.
CPC .............. *H01L 41/053* (2013.01); *H01L 41/09* (2013.01); *H01L 41/0973* (2013.01);
(Continued)

(58) Field of Classification Search
CPC ...... H04R 1/403; H04R 1/2896; H04R 17/00; H01L 41/053; H01L 41/09; H01L 41/0973
USPC .......................................................... 367/165
See application file for complete search history.

(56) References Cited

U.S. PATENT DOCUMENTS

| 4,583,018 A | 4/1986 | Izumi et al. |
| 4,751,419 A * | 6/1988 | Takahata ....................... 310/324 |

(Continued)

FOREIGN PATENT DOCUMENTS

| CN | 1969198 | 5/2007 |
| JP | 59-099900 | 6/1984 |

(Continued)

OTHER PUBLICATIONS

Chinese Office Action, dated Feb. 4, 2015, in corresponding Chinese Patent Application No. 201180061418.8.
(Continued)

*Primary Examiner* — Mark Hellner
(74) *Attorney, Agent, or Firm* — Young & Thompson

(57) ABSTRACT

In an electro-acoustic transducer 100 which is an oscillator device, center positions of principal surfaces of piezoelectric elements 130 that are positioned on both surfaces of an elastic member 120 are different from each other. As such, since the two piezoelectric elements 130 are disposed asymmetrically on the upper and lower sides in the electro-acoustic transducer 100, it is possible to prevent vibrations of reversed phases at the time of divided vibration in which the reversed phases overlap with each other. In other words, since it is possible to prevent the generation of sound waves due to the vibration of local reversed phases, the sound pressure level can be improved.

11 Claims, 3 Drawing Sheets

(51) Int. Cl.
  *H04R 1/40* (2006.01)
  *H01L 41/09* (2006.01)
  *H04R 1/28* (2006.01)
  *G01S 15/08* (2006.01)

(52) U.S. Cl.
  CPC .............. *H04R 1/403* (2013.01); *G01S 15/08* (2013.01); *H04R 1/2896* (2013.01); *H04R 17/00* (2013.01); *H04R 2499/11* (2013.01)

(56) References Cited

U.S. PATENT DOCUMENTS

| | | |
|---|---|---|
| 7,372,771 B2 | 5/2008 | Park |
| 7,550,899 B2 * | 6/2009 | Fujiwara et al. ............... 310/324 |
| 7,550,904 B2 * | 6/2009 | Kawakubo et al. ........... 310/365 |
| 2008/0018203 A1 | 1/2008 | Fujiwara et al. |
| 2008/0053233 A1 | 3/2008 | Sugiura |
| 2010/0038998 A1 | 2/2010 | Onishi |

FOREIGN PATENT DOCUMENTS

| | | |
|---|---|---|
| JP | 62-200900 | 9/1987 |
| JP | 2008-028593 | 2/2008 |
| JP | 2008-079230 | 4/2008 |
| JP | 2009-151666 | 7/2009 |
| JP | 2011-254295 | 12/2011 |
| WO | 00/18182 A1 | 3/2000 |

OTHER PUBLICATIONS

International Search Report PCT/JP2011/007099 dated Jan. 31, 2012, with English translation.
Extended European Search Report dated May 9, 2014; Application No. 11851313.4.
Japanese Office Action dated Oct. 27, 2015; Application No. 2012-549633.

\* cited by examiner

OSCILLATOR DEVICE AND ELECTRONIC APPARATUS

TECHNICAL FIELD

The present invention relates to an oscillator device using a piezoelectric element, and an electronic apparatus using the oscillator device.

BACKGROUND ART

In cellular phones, the development of thin stylish portable devices having sound functions such as music reproduction or hands-free as commodity values has been actively conducted. In this regard, there is increasing demand for electro-acoustic transducers that are made small and thin and that has a high-quality sound. As means to respond to the demand, piezoelectric electro-acoustic transducers using a piezoelectric element as a driving source have been developed. Since the piezoelectric electro-acoustic transducers use a self-expansion and contraction motion of the piezoelectric element, the piezoelectric electro-acoustic transducers are thinner than electrodynamic electro-acoustic transducers constituted by a magnetic circuit.

At present, various types of electro-acoustic transducers have been proposed (Patent Document 1).

RELATED DOCUMENT

Patent Document

[Patent Document 1] Japanese Unexamined Patent Publication No. 2009-151666

DISCLOSURE OF THE INVENTION

However, in piezoelectric electro-acoustic transducers, piezoelectric ceramics with a high stiffness are used as a driving source, and thus a machine quality coefficient is high. In this case, there is a problem in that although it is possible to secure a high sound pressure level in the vicinity of a fundamental resonance frequency, the sound pressure level attenuates in other bands. In other words, it is difficult to secure a sufficient sound pressure level due to the irregularity of acoustic characteristics.

Further, since the piezoelectric electro-acoustic transducers are influenced by a piezoelectric element having a high machine quality coefficient Q, its vibration mode becomes a bending-type vibration. In other words, since the piezoelectric electro-acoustic transducers have a large displacement distribution in a central portion thereof and have a small displacement distribution in an end portion thereof, the piezoelectric electro-acoustic transducers are disadvantageous in terms of volume exclusion as compared with the electrodynamic electro-acoustic transducers that oscillate in a piston motion mode, and thus have a problem in a sound pressure level.

The invention is contrived in view of such circumstances, and an object of thereof is to provide a piezoelectric oscillator device capable of securing a sufficient sound pressure level, and an electronic apparatus using the oscillator device.

An oscillator device of the invention includes a frame-shaped supporting frame, a flat elastic member that is supported by an outer circumferential portion in the supporting frame, and at least two piezoelectric elements of which at least one is disposed on each of both surfaces of the elastic member and which move expansively and contractively through the application of an electric field, wherein center positions of principal surfaces of the piezoelectric elements that are positioned on both surfaces of the elastic member are different from each other.

A first electronic apparatus of the invention includes the oscillator device of the invention, and an oscillation driving unit that causes the oscillator device to output ultrasonic waves demodulated into sound waves of an audible zone.

A second electronic apparatus of the invention includes the oscillator device of the invention, an oscillation driving unit that causes the oscillator device to output the ultrasonic waves, an ultrasonic wave detection unit that detects the ultrasonic waves oscillating from the oscillator device and reflected by an object to be measured, and a distance measurement unit that measures a distance to the object to be measured on the basis of the detected ultrasonic waves.

Meanwhile, various components of the invention do not need to be necessarily independent components. For example, a plurality of components may be formed as one member, one component may be formed of a plurality of members, a certain component may be a part of another component, or a part of a certain component and a part of another component may overlap with each other.

According to the invention, it is possible to provide a piezoelectric oscillator device capable of securing a sufficient sound pressure level.

BRIEF DESCRIPTION OF THE DRAWINGS

The above-described objects, other objects, features and advantages will be further apparent from the preferred embodiments described below, and the accompanying drawings as follows.

DESCRIPTION OF EMBODIMENTS

Figure 1:
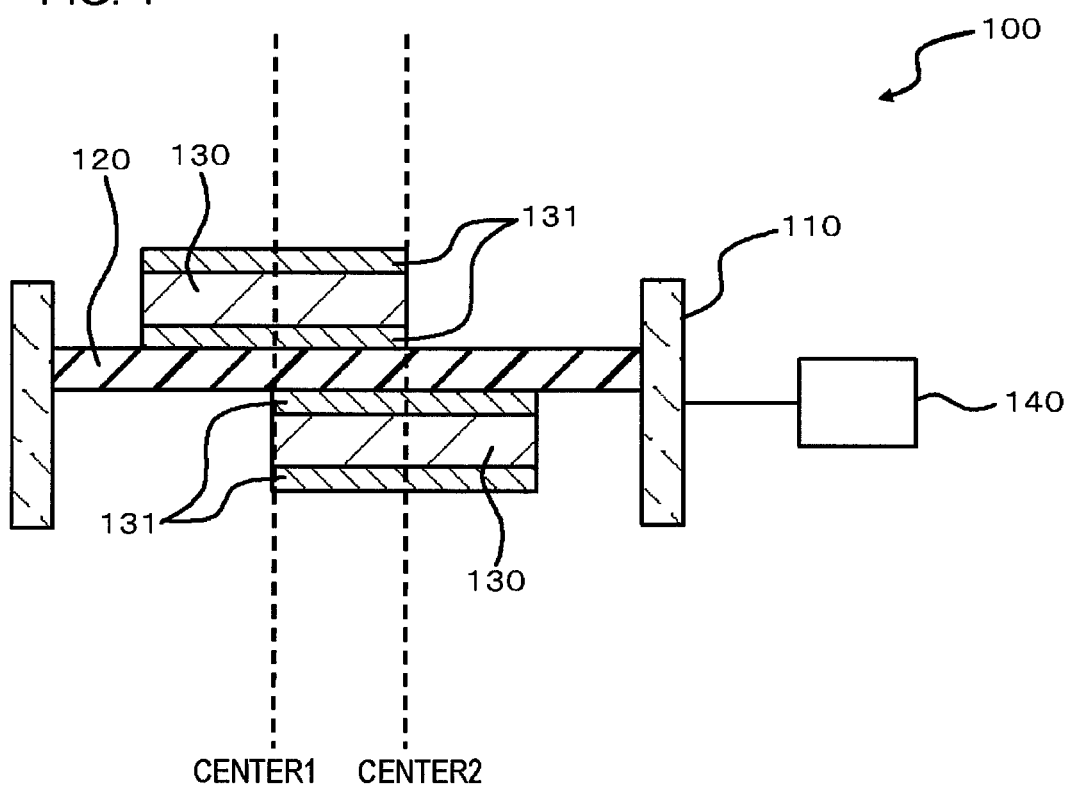
FIG. 1 is a schematic vertical cross-sectional front view illustrating a structure of an electro-acoustic transducer which is an oscillator device according to an embodiment of the invention.

FIG. 1 is a schematic vertical cross-sectional front view illustrating an electro-acoustic transducer 100 which is an oscillator device according to an embodiment of the invention.

Hereinafter, the electro-acoustic transducer 100 which is an oscillator device of the embodiment will be described with reference to FIG. 1. As illustrated in FIG. 1, the electro-acoustic transducer 100 of the embodiment includes a frame-shaped supporting frame 110, a flat elastic member 120 that is supported by an outer circumferential portion of the supporting frame 110, and at least two piezoelectric elements 130 of which at least one is disposed on each of both surfaces of the elastic member 120 and which move expansively and contractively through the application of an electric field.

However, in the electro-acoustic transducer 100 of the embodiment, as described above, center positions of principal surfaces of the piezoelectric elements 130 disposed on the both surfaces of the elastic member 120 are different from each other. In more detail, the center of the principal surface of the first piezoelectric element 130 positioned on one surface of the elastic member 120 overlaps with a lateral surface of the second piezoelectric element 130 that is positioned on the other surface of the elastic member 120 when seen in a plan view. In addition, the center of the second piezoelectric element 130 overlaps with the lateral surface of the first piezoelectric element 130 when seen in a plan view. Meanwhile, plane surfaces of the piezoelectric element 130 and the supporting frame 110 may have a circular shape or a square which is a rectangular shape or the like (not shown).

Meanwhile, electrode layers 131 are formed on each of the two principal surfaces of the piezoelectric elements 130, and are connected to a driver circuit 140 which is an oscillation driving unit. For this reason, the piezoelectric element 130 oscillates with a frequency of an ultrasonic wave band of 20 kHz or more. The elastic member 120 is formed of a metal, and is insulated from the electrode layer 131 of the piezoelectric element 130. However, the elastic member 120 can also be a part of a wiring connecting the piezoelectric element 130 and the driver circuit by allowing electrical conduction between the electrode layer 131 and the elastic member 120.

The piezoelectric element 130 is formed of a material having a piezoelectric effect. Although the material for forming the piezoelectric element 130 is not particularly limited to an inorganic material and an organic material, a material such as zirconate titanate (PZT) or barium titanate ($BaTiO_3$) which is a material with high electromechanical conversion efficiency can be used. In addition, the thickness of the piezoelectric element 130 is not particularly limited, but is preferably equal to or more than 10 μm and equal to or less than 1 mm.

When a thin film having a thickness of less than 10 μm is used as a ceramic material which is a brittle material, a crack and damage occurs due to the weakness of mechanical strength during handling, and thus it is difficult to handle the thin film. In addition, when ceramic having a thickness of more than 1 mm is used, conversion efficiency in which electrical energy is converted into mechanical energy considerably decreases, and thus a sufficient performance as the electro-acoustic transducer 100 is not obtained. Generally, in a piezoelectric ceramic that generates an electrostrictive effect through an input of an electrical signal, the conversion efficiency depends on a field intensity. Since the field intensity represented by a thickness with respect to a polarization direction/input voltage, an increase in thickness inevitably results in a decrease in conversion efficiency.

The electrode layer 131 is formed in the principal surface of the piezoelectric element 130 of the embodiment in order to generate an electric field. Although a material of the electrode layer 131 is not particularly limited, for example, silver or silver/palladium can be used. Since silver is used as a low-resistance versatile electrode material, there is an advantage in a manufacturing process or cost and the like. Since silver/palladium is a low-resistance material excellent in oxidation resistance, there is an advantage from the viewpoint of reliability.

In addition, the thickness of the electrode layer 131 is not particularly limited, but the thickness is preferably equal to or more than 1 μm and equal to or less than 50 μm. When the thickness of the electrode layer 131 is less than 1 μm, a film thickness is thin, and thus it is difficult to uniformly form the electrode layer 131. For this reason, there is a possibility of the conversion efficiency decreasing. When the thickness of the electrode layer 131 exceeds 50 μm, there is no particular manufacturing problem, but the electrode layer 131 serves as a constraint surface with respect to the ceramic material of the piezoelectric element 130, and thus the energy conversion efficiency decreases.

A material, such as a metal or a resin, having a high elastic modulus with respect to ceramic which is a brittle material can be used as the material of the elastic member 120. A general-purpose material, for example, phosphor bronze or stainless steel, is used as the material of the elastic member 120 from the viewpoint of workability or costs. In addition, the thickness of the elastic member 120 is preferably equal to or more than 5 μm and equal to or less than 1000 μm. When the thickness of the elastic member 120 is less than 5 μm, there are problems in that a function of the elastic member 120 as a constraint member is affected due to a low mechanical strength and that variation in machinery vibration feature of a vibrator occurs between production lots due to a reduction in processing accuracy.

A mechanism for generating sound waves uses an expansion and contraction motion occurring by an electric field being applied to the piezoelectric element 130. In addition, a frequency of ultrasonic waves is limited to 20 kHz or more. Since the piezoelectric element 130 has a high machine quality coefficient Q, energy is concentrated on the vicinity of a fundamental resonance frequency. For this reason, although a high sound pressure level can be obtained in the fundamental resonance frequency band, sound pressure attenuates in other frequency bands.

Since the electro-acoustic transducer 100 of the embodiment oscillates ultrasonic waves limited to a specific frequency, the electro-acoustic transducer 100 has an advantage rather as a feature that a machine quality coefficient Q of the piezoelectric element 130 is high. In addition, since a fundamental resonance frequency of a piezoelectric vibrator is affected by the shape of the piezoelectric element 130, when a resonance frequency is adjusted in a high frequency band, for example, an ultrasonic wave band, the electro-acoustic transducer 100 has an advantage in miniaturization.

Meanwhile, the electro-acoustic transducer 100 of the embodiment performs acoustic reproduction on the basis of a so-called parametric speaker principle that oscillates ultrasonic waves on which FM (Frequency Modulation) or AM (Amplitude Modulation) is performed and that demodulates modulation waves using a non-linear state (sparse and dense state) of air to reproduce an audible sound. In the electro-acoustic transducer 100 of the embodiment, the piezoelectric element 130 has a configuration limited to the oscillation of a high frequency band, and thus the miniaturization of the electro-acoustic transducer 100 is possible.

According to the above-described configuration, in the piezoelectric electro-acoustic transducer 100 having the configuration, unlike a general bimorph structure, the center positions of the principal surfaces of the piezoelectric elements 130 that are positioned on both surfaces of the elastic member 120 are different from each other. In other words, the center position of the principal surface of the first piezoelectric element 130 that is positioned on one surface of the elastic member 120 overlaps with the lateral surface of the second piezoelectric element 130 that is positioned on the other surface when seen in a plan view, and the center position of the second piezoelectric element 130 overlaps with the lateral surface of the first piezoelectric element 130 when seen in a plan view.

As such, two piezoelectric elements 130 are disposed asymmetrically on the upper and lower sides in the electro-acoustic transducer 100. Accordingly, uniformity and periodicity in a vibrating surface is lost, and thus the degeneracy of vibration can be prevented. Therefore, a plurality of vibration modes can be created.

In addition, through such arrangement, during a divided vibration in which a normal phase and a reversed phase overlap with each other, the vibration of the reversed phase can be prevented. In other words, the generation of sound waves due to the vibration of a local reversed phase can be prevented. For this reason, mutual cancellation between the sound waves due to the vibration of the normal phase and the sound waves due to the vibration of the reversed phase is prevented. Therefore, it is possible to improve a sound pressure level of the electro-acoustic transducer 100.

Generally, a vibration mode of the reversed phase is formed focusing on the electro-acoustic transducer 100. In the electro-acoustic transducer 100 of the embodiment, the centers of the plurality of piezoelectric elements 130 are different. In this case, the stiffness of a central portion of the electro-acoustic transducer 100 increases. Therefore, it is possible to prevent the vibration of the reversed phase from increasing.

In addition, the operation principle of the electro-acoustic transducer 100 of the embodiment uses an expansion and contraction motion occurring when an electric field is applied to the piezoelectric element 130. A frequency for oscillation is preferably set to an ultrasonic wave band of 20 kHz or more. By setting the oscillating frequency to the ultrasonic wave band, the size of the piezoelectric element 130 can be reduced, and directivity can be controlled using straightness of the ultrasonic waves. As an application example thereof, the invention can also be used in a parametric speaker that transfers an audio signal by ultrasonic waves and demodulates the audio signal in the air.

Figure 2:
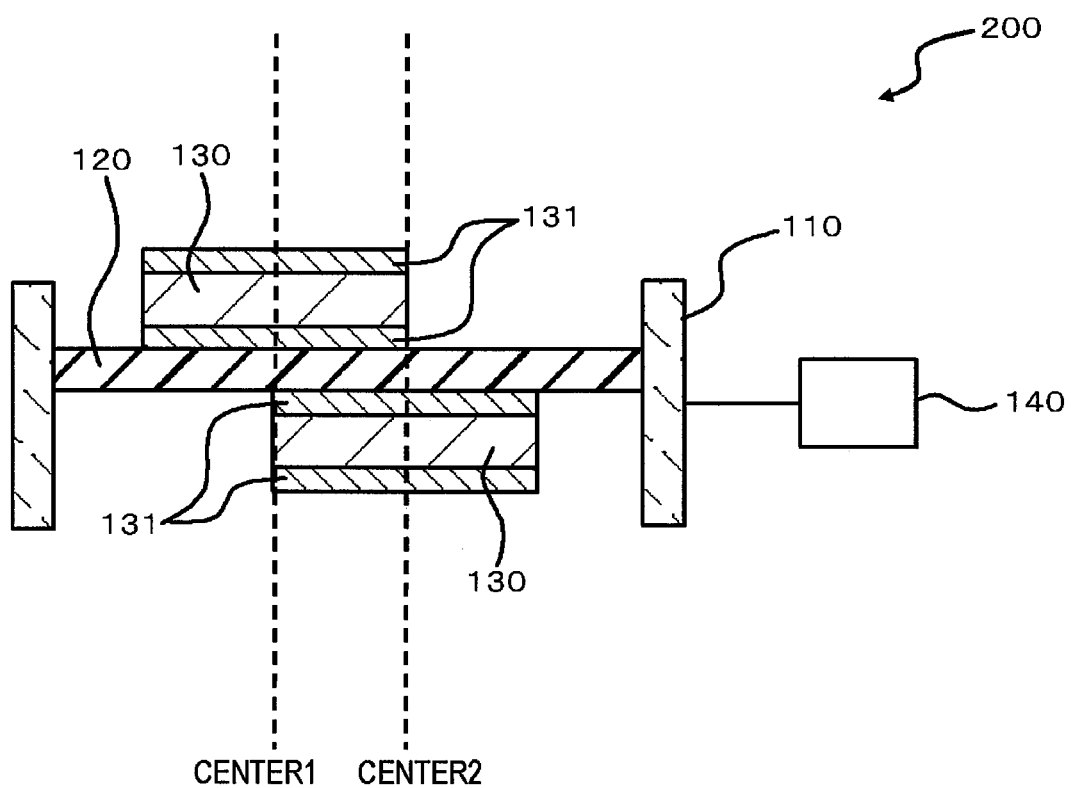
FIG. 2 is a schematic vertical cross-sectional front view illustrating a structure of an electro-acoustic transducer which is an oscillator device according to a modified example.

FIG. 2 is a schematic vertical cross-sectional front view illustrating a structure of an electro-acoustic transducer 200 which is an oscillator device according to a modified example of the invention.

The invention is not limited to the embodiment, and allows various modifications thereof without departing from the scope of the invention. For example, in the above embodiment, the configuration in which the elastic member 120 is formed of a metal has been exemplified. However, like the electro-acoustic transducer 200 exemplified as an oscillator device in FIG. 2, the elastic member 120 may be formed of a resin. In this case, the elastic member 120 is formed of a polymer material having a longitudinal elastic modulus of, for example, 100 GPa or less. The elastic member 120 can be formed of, for example, polyethylene terephthalate, polyethylene, urethane, silicon rubber, natural rubber, or synthetic rubber from the viewpoint of versatility.

In addition, the thickness of the elastic member 120 is preferably equal to or more than 5 µm and equal to or less than 1000 µm. When the thickness of the elastic member 120 exceeds 1000 µm, there is a problem in that the constraint on the piezoelectric element 130 due to an increase in stiffness increases to thereby cause the attenuation of the amount of vibration displacement.

In addition, it is preferable that the elastic member 120 of the embodiment have a longitudinal elastic modulus, which is an index indicating the stiffness of a material, of equal to or more than 1 GPa and equal to or less than 500 GPa. When the stiffness of the elastic member 120 is excessively low or high, there is a problem in that the characteristics and reliability as a mechanical vibrator are damaged.

Meanwhile, in the electro-acoustic transducer 200, an end of the vibrating surface on which stress is concentrated during vibration is constituted by the elastic member 120 formed of a resin rich in flexibility. In other words, since striking energy at the time of drop can be absorbed by the elastic member 120 formed of a resin, drop strength can be improved.

In addition, in the electro-acoustic transducer 200, an end between the supporting frame 110 and the piezoelectric element 130 is constituted by the resin of the elastic member 120. In other words, as the elastic member 120 formed of a resin rich in flexibility is positioned at an end of vibration, a movable range of the end broadens. In this case, the vibration mode becomes closer to a piston shape, and the amount of volume exclusion during vibration increases. Since a sound pressure level depends on the amount of volume exclusion to the air during the vibration, it is possible to realize an advantageous feature in the electro-acoustic transducer 200 having the configuration.

Figure 3:
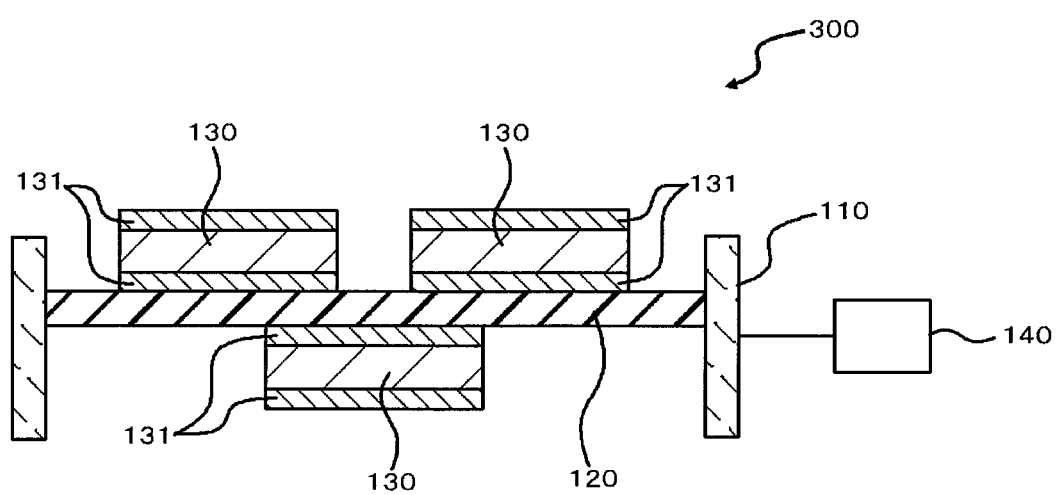
FIG. 3 is a schematic vertical cross-sectional front view illustrating a structure of an electro-acoustic transducer which is an oscillator device according to another modified example.

FIG. 3 is a schematic vertical cross-sectional front view illustrating a structure of an electro-acoustic transducer 300 which is an oscillator device according to another modified example.

In the above embodiment, the configuration in which the piezoelectric elements 130 are respectively disposed on the both surfaces of the elastic member 120 has been exemplified. However, like the electro-acoustic transducer 300 illustrated in FIG. 3, a plurality of the piezoelectric elements 130 may be disposed on one surface or both surfaces of the elastic member 120.

As illustrated in FIG. 3, the electro-acoustic transducer 300 includes a first piezoelectric element 130 and a third piezoelectric element 130 that are disposed on one surface of the elastic member 120, and a second piezoelectric element 130 disposed on the other surface of the elastic member 120. The center positions of principal surfaces of the first piezoelectric element 130 and the third piezoelectric element 130 are different from the center position of a principal surface of the second piezoelectric element 130.

Even in the modified example, the same effects as the electro-acoustic transducer 100 according to the above-described embodiment can be obtained.

In addition, in the above embodiment, the electronic apparatus in which the driver circuit 140 which is an oscillation driving unit is connected to the electro-acoustic transducer 100 has been assumed. However, it is also possible to implement an electronic apparatus (not shown) such as a sonar including the electro-acoustic transducer 100, the oscillation driving unit that causes the electro-acoustic transducer 100 to output ultrasonic waves, an ultrasonic wave detection unit for detecting ultrasonic waves that oscillate from the electro-acoustic transducer 100 and are reflected by an object to be measured, and a distance measurement unit that measures a distance to the object to be measured on the basis of the detected ultrasonic waves.

Meanwhile, as a matter of course, the above-described embodiments and the above-described modified examples can be combined within a range in which contents thereof do not conflict with each other. Additionally, in the above-described embodiments and the above-described modified examples, a structure and the like of each component have been described in detail, but the structure and the like can be changed in various ways within a range satisfying the invention.

The application claims the priority based on Japanese Patent Application No. 2010-282666 filed on Dec. 20, 2010, the content of which is incorporated herein by reference.

The invention claimed is:

1. An oscillator device comprising:
a frame-shaped supporting frame;
a flat elastic member that is supported by an outer circumferential portion in the supporting frame; and at least two piezoelectric elements of which at least one is disposed on each of both surfaces of the elastic member and which move expansively and contractively through the application of an electric field, wherein center positions of principal surfaces of the piezoelectric elements that are positioned on both surfaces of the elastic member are different from each other, wherein the center of the principal surface of the first piezoelectric element that is positioned on one surface of the elastic member overlaps with a lateral surface of the second piezoelectric element that is positioned on the other surface of the elastic member when seen in a plan view, and wherein the center of the second piezoelectric element overlaps with a lateral surface of the first piezoelectric element when seen in a plan view.

2. The oscillator device according to claim 1, wherein the elastic member is formed of a metal.

3. The oscillator device according to claim 1, wherein the elastic member is formed of a resin.

4. The oscillator device according to claim 1, wherein the piezoelectric element oscillates with a frequency of an ultrasonic wave band of 20 kHz or more.

5. An electronic apparatus comprising:
the oscillator device according to claim 1; and
an oscillation driving unit that causes the oscillator device to output ultrasonic waves demodulated into sound waves of an audible zone.

6. An electronic apparatus comprising:
the oscillator device according to claim 1;
an oscillation driving unit that causes the oscillator device to output the ultrasonic waves;
an ultrasonic wave detection unit that detects the ultrasonic waves oscillating from the oscillator device and reflected by an object to be measured; and
a distance measurement unit that measures a distance to the object to be measured on the basis of the detected ultrasonic waves.

7. An electronic apparatus comprising:
an oscillator device;
an oscillation driving unit that causes the oscillator device to output ultrasonic waves;
an ultrasonic wave detection unit that detects the ultrasonic waves oscillating from the oscillator device and reflected by an object to be measured; and
a distance measurement unit that measures a distance to the object to be measured on the basis of the detected ultrasonic waves,
wherein the oscillator device comprises:
a frame-shaped supporting frame;
a flat elastic member that is supported by an outer circumferential portion in the supporting frame; and
at least two piezoelectric elements of which at least one is disposed on each of both surfaces of the elastic member and which move expansively and contractively through the application of an electric field,
wherein center positions of principal surfaces of the piezoelectric elements that are positioned on both surfaces of the elastic member are different from each other.

8. The electronic apparatus according to claim 7, wherein the plurality of piezoelectric elements are disposed in parallel with each other on one surface of the elastic member.

9. The electronic apparatus according to claim 7, wherein the elastic member is formed of a metal.

10. The electronic apparatus according to claim 7, wherein the elastic member is formed of a resin.

11. The electronic apparatus according to claim 7, wherein the piezoelectric element oscillates with a frequency of an ultrasonic wave band of 20 kHz or more.

* * * * *